United States Patent
Hwang

(10) Patent No.: US 12,317,557 B1
(45) Date of Patent: May 27, 2025

(54) STRUCTURES WITH DEEP TRENCH ISOLATION REGIONS FOR A HIGH-VOLTAGE FIELD-EFFECT TRANSISTOR

(71) Applicant: GlobalFoundries Singapore Pte. Ltd., Singapore (SG)

(72) Inventor: Kyong Jin Hwang, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/908,950

(22) Filed: Oct. 8, 2024

(51) Int. Cl.
| | | |
|---|---|---|
| *H10D 62/10* | (2025.01) | |
| *H01L 21/762* | (2006.01) | |
| *H01L 21/768* | (2006.01) | |

(52) U.S. Cl.
CPC ..... *H10D 62/124* (2025.01); *H01L 21/76229* (2013.01); *H01L 21/76831* (2013.01)

(58) Field of Classification Search
CPC ..... H10D 30/0281; H10D 30/65; H10D 30/60
See application file for complete search history.

(56) References Cited

U.S. PATENT DOCUMENTS

| | | | |
|---|---|---|---|
| 4,589,193 A * | 5/1986 | Goth | H01L 21/76237 148/DIG. 86 |
| 8,294,203 B2 | 10/2012 | Van Noort et al. | |
| 8,642,423 B2 | 2/2014 | Messenger et al. | |
| 8,809,994 B2 | 8/2014 | Booth, Jr. et al. | |
| 9,490,223 B2 | 11/2016 | Cheng et al. | |
| 9,653,507 B2 | 5/2017 | Chou et al. | |
| 9,673,084 B2 | 6/2017 | Liu et al. | |
| 10,325,956 B2 | 6/2019 | Chou et al. | |
| 2011/0147884 A1* | 6/2011 | Van Noort | H01L 21/743 257/E21.546 |
| 2015/0380447 A1* | 12/2015 | Chou | H10D 84/0188 438/72 |
| 2016/0163583 A1* | 6/2016 | Liu | H01L 27/0922 438/430 |
| 2018/0166322 A1 | 6/2018 | Lee et al. | |

* cited by examiner

*Primary Examiner* — Raj R Gupta
(74) *Attorney, Agent, or Firm* — Thompson Hine LLP; Francois Pagette

(57) ABSTRACT

Structures for a high-voltage field-effect transistor that include a deep trench isolation region and methods of forming such structures. The structure comprises a semiconductor substrate, a semiconductor layer on the semiconductor substrate, and a doped layer between the semiconductor layer and the semiconductor substrate. The structure further comprises a trench isolation region including a metal layer that extends through the semiconductor layer and the doped layer into the semiconductor substrate.

20 Claims, 6 Drawing Sheets

STRUCTURES WITH DEEP TRENCH ISOLATION REGIONS FOR A HIGH-VOLTAGE FIELD-EFFECT TRANSISTOR

BACKGROUND

The disclosure relates generally to semiconductor devices and integrated circuit fabrication and, more specifically, to structures for a high-voltage field-effect transistor that include a deep trench isolation region and methods of forming such structures.

Complementary-metal-oxide-semiconductor processes may be used to build a combination of p-type and n-type field-effect transistors that are used to construct, for example, logic cells. Field-effect transistors generally include a channel region in a substrate, a source, a drain, and a gate structure over the channel region. When a control voltage exceeding a characteristic threshold voltage is applied to a gate electrode of the gate structure, carrier flow occurs in the channel region between the source and drain to produce a device output current.

A field-effect transistor may be configured to operate at a high voltage, such as voltages in excess of one hundred volts. High-voltage field-effect transistors that are electrically isolated by conventional deep trench isolation regions are prone to latch-up and electrostatic discharge failures. The formation of conventional deep trench isolation regions may also introduce dislocations that reduce product yield.

Improved structures for a high-voltage field-effect transistor that include a deep trench isolation region and methods of forming such structures are needed.

SUMMARY

In an embodiment, a structure comprises a semiconductor substrate, a semiconductor layer on the semiconductor substrate, and a doped layer between the semiconductor layer and the semiconductor substrate. The structure further comprises a trench isolation region including a metal layer that extends through the semiconductor layer and the doped layer into the semiconductor substrate.

In an embodiment, a method comprises forming a semiconductor layer on a semiconductor substrate, forming a doped layer between the semiconductor layer and the semiconductor substrate, and forming a trench isolation region including a metal layer that extends through the semiconductor layer and the doped layer into the semiconductor substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
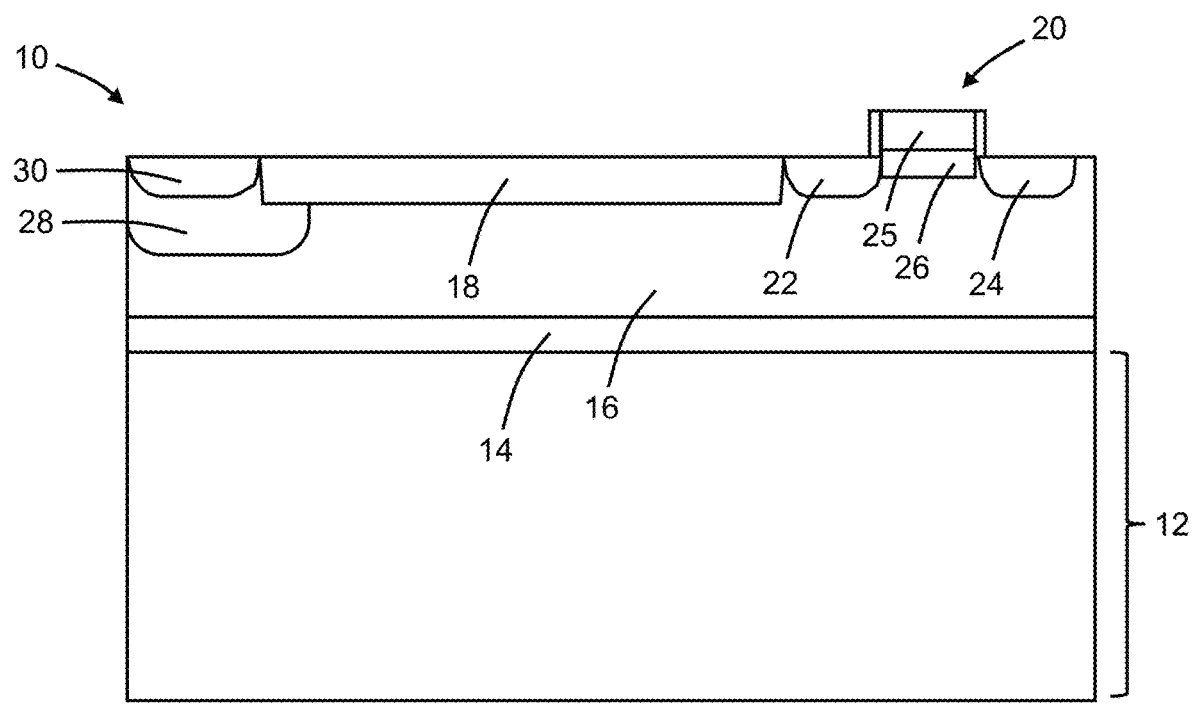
FIG. 1 is a cross-sectional view of a structure in accordance with embodiments of the invention.

With reference to FIG. 1 and in accordance with embodiments of the invention, a device structure 10 includes a semiconductor substrate 12, a semiconductor layer 16, a doped layer 14 in the semiconductor layer 16, and a shallow trench isolation region 18. The semiconductor substrate 12 may be comprised of a semiconductor material, such as single-crystal silicon, doped to have p-type conductivity. The semiconductor substrate 12 may be coupled to a ground potential. The doped layer 14 may be doped to have an opposite conductivity type from the semiconductor substrate 12 and the same conductivity type as the semiconductor layer 16. The semiconductor layer 16, which may be epitaxially grown on the semiconductor substrate 12, may be comprised of a semiconductor material, such as single-crystal silicon, doped to have n-type conductivity.

The semiconductor layer 16 may be formed by an epitaxial growth process and may be doped during the epitaxial growth process with an n-type dopant, such as phosphorus, to provide n-type conductivity. The doped layer 14 may contain a concentration of an n-type dopant, such as phosphorus, such that the doped layer 14 has n-type conductivity. In an embodiment, the doped layer 14 may be formed by introducing an n-type dopant by, for example, a masked ion implantation into a lower portion of the semiconductor layer 16. The implantation conditions, such as ion species, dose, and kinetic energy, may be selected to tune the electrical and physical characteristics of the doped layer 14. For example, the doped layer 14 may be a highly-doped n-type layer. The doped layer 14 may have the same conductivity type as the semiconductor layer 16 and may be more heavily doped than the semiconductor layer 16. The doped layer 14 is positioned between the semiconductor substrate 12 and the unimplanted upper portion of the semiconductor layer 16. The shallow trench isolation region 18 may be formed by patterning a shallow trench with lithography and etching processes, depositing a dielectric material, such as silicon dioxide, in the shallow trench, and planarizing and/or recessing the deposited dielectric material.

A device structure 20 may be formed in a region of the semiconductor substrate 12. The device structure 20 may be a field-effect transistor that includes source/drain regions 22, 24 and a gate structure that may include an upper layer 25 comprised of a conductor, such as doped polysilicon, and a lower layer 26 comprised of an electrical insulator, such as silicon dioxide. As used herein, the term "source/drain region" means a region of semiconductor material that can function as either a source or a drain of a field-effect transistor. In an embodiment, the source/drain regions 22, 24 may contain a concentration of an n-type dopant, such as phosphorus, to provide n-type conductivity. The source/drain regions 22, 24 may be formed by selectively implanting ions, such as ions including an n-type dopant, with an implantation mask having openings defining the intended locations for the source/drain regions 22, 24 in the semiconductor layer 16. The implantation conditions, such as ion species, dose, and kinetic energy, may be selected to tune the electrical and physical characteristics of the source/drain regions 22, 24. The thickness of the lower layer 26 of the gate structure may have be selected to permit operation of the device structure 20 at a high operating voltage.

A well 28 and a doped region 30 may be separately formed in the semiconductor layer 16. The well 28 and the doped region 30 may be positioned adjacent to the shallow trench isolation region 18. The doped region 30 may be positioned between the well 28 and the top surface of the semiconductor layer 16. The well 28 may be formed by selectively implanting ions, such as ions including an n-type dopant, with an implantation mask having an opening defining the intended location for the well 28 in the semiconductor layer 16. The implantation conditions, such as ion species, dose, and kinetic energy, may be selected to tune the electrical and physical characteristics of the well 28. The doped region 30 may be formed by selectively implanting ions, such as ions including an n-type dopant, with an implantation mask having an opening defining the intended location for the doped region 30 in the semiconductor layer 16. The implantation conditions, such as ion species, dose, and kinetic energy, may be selected to tune the electrical and physical characteristics of the doped region 30. In an embodiment, the doped region 30 may be formed along with the source/drain regions 22, 24 of the device structure 20 and may be more heavily doped than the well 28.

Figure 2:
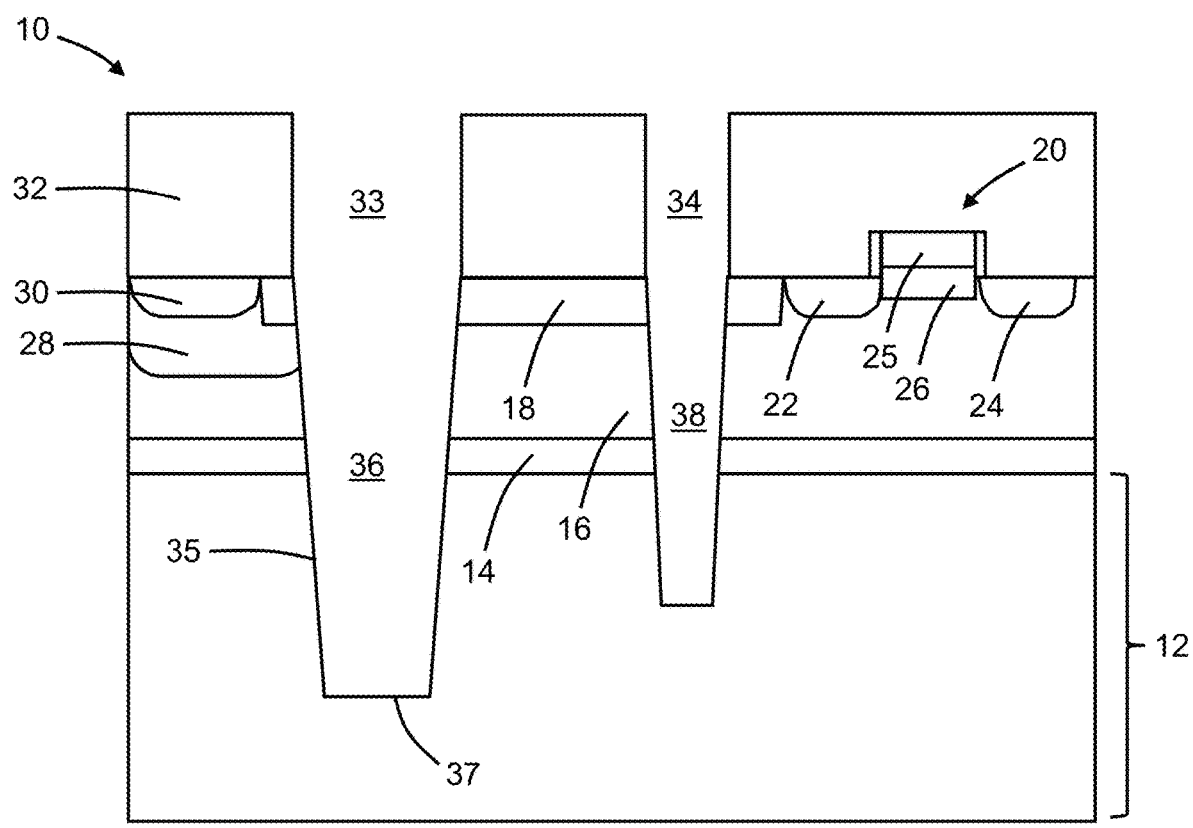
FIG. 2 is a cross-sectional view of the structure at a fabrication stage subsequent to FIG. 1.

With reference to FIG. 2 in which like reference numerals refer to like features in FIG. 1 and at a subsequent fabrication stage, a hardmask 32 may be formed and patterned to define an opening 33 and an opening 34. The hardmask 32 may be comprised of, for example, silicon nitride that is deposited and then patterned by lithography and etching processes to form the openings 33, 34. The openings 33, 34 in the hardmask 32 may be aligned with different portions of the shallow trench isolation region 18. In an embodiment, the opening 33 may be patterned with a larger width dimension than the opening 34.

A trench 36 may be formed that is aligned with the opening 33 in the hardmask 32, and a trench 38 may be formed at the location of the opening 34 in the hardmask 32. The trench 38 is laterally positioned between the trench 36 and the device structure 20. The trench 36 may include sidewalls 35 and a bottom 37. The trenches 36, 38 may be formed by an etching processes that relies upon the hardmask 32. The trenches 36, 38 extend into the semiconductor substrate 12 after penetrating through the shallow trench isolation region 18 and then through a portion of the semiconductor layer 16 beneath the shallow trench isolation region 18 and a portion of the doped layer 14. The trench 36 may extend to a greater depth in the semiconductor substrate 12 at its bottom 37 than the trench 38 because to the width dimension of the opening 33 is larger than the width dimension of the opening 34.

Figure 3:
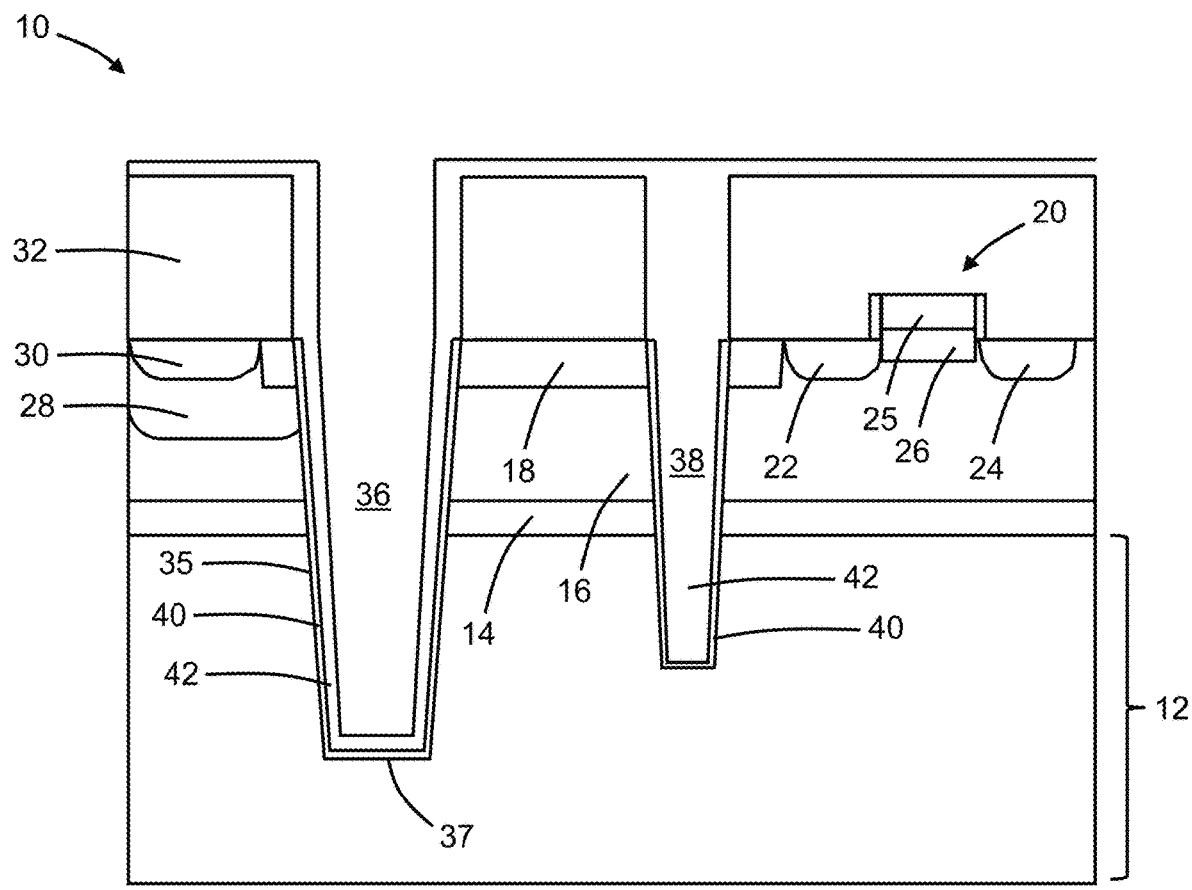
FIG. 3 is a cross-sectional view of the structure at a fabrication stage subsequent to FIG. 2.

With reference to FIG. 3 in which like reference numerals refer to like features in FIG. 2 and at a subsequent fabrication stage, a dielectric layer 40 may be formed on the sidewalls 35 and bottom 37 of the trench 36. The dielectric layer 40 may be comprised on a dielectric material that is an electrical insulator. In an embodiment, the dielectric layer 40 may be comprised of silicon dioxide that is formed by an oxidation process performed at a low temperature such that the source/drain regions 22, 24 are not impacted. The formation of the dielectric layer 40 may remove defects at the sidewalls 35 and bottom 37 of the trench 36 formed by the patterning of the trenches 36, 38. The dielectric layer 40 also forms on the sidewalls and bottom of the trench 38.

A dielectric layer 42 may be formed inside the trench 36 and the trench 38 on the dielectric layer 40. The dielectric layer 42 may be comprised on a dielectric material that is an electrical insulator. In an embodiment, the dielectric layer 42 may be comprised of silicon dioxide or silicon nitride that is formed by a deposition process performed at a low temperature such that the source/drain regions 22, 24 are not impacted. The dielectric layer 42 may fill the remainder of the space inside the trench 38 that is unfilled by the dielectric layer 40 such that the trench 38 is fully filled by dielectric material to represent a trench isolation region. The dielectric layer 40 and the dielectric layer 42 only partially fill the trench 36 such that a central open space exists inside the trench 36.

Figure 4:
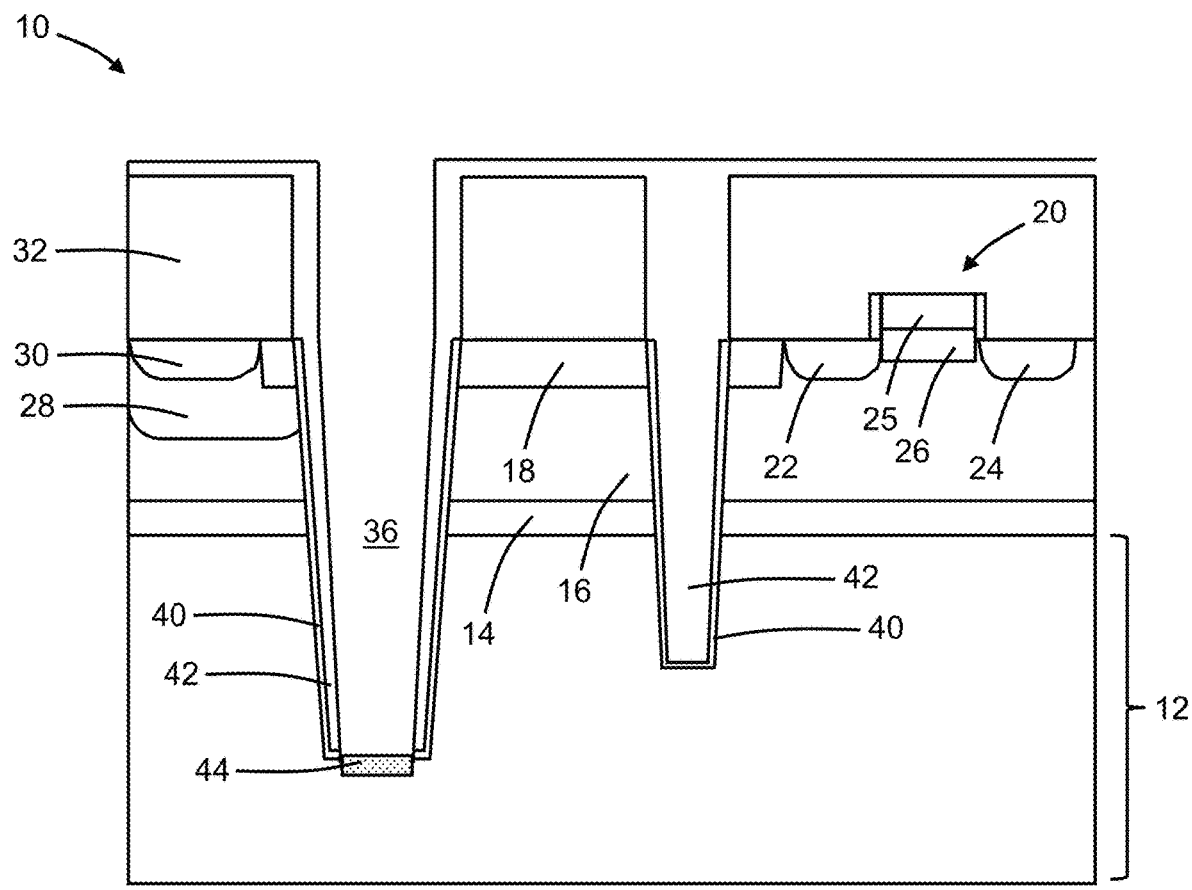
FIG. 4 is a cross-sectional view of the structure at a fabrication stage subsequent to FIG. 3.

With reference to FIG. 4 in which like reference numerals refer to like features in FIG. 3 and at a subsequent fabrication stage, portions of the dielectric layers 40, 42 may be removed from the bottom 37 of the trench 36 to expose the semiconductor material of the semiconductor substrate 12. A conductive region 44 may be formed at the bottom 37 of the trench 36 after the dielectric layers 40, 42 are removed from the bottom 37 of the trench 36. In an embodiment, the conductive region 44 may be comprised of a deposited silicide, such as titanium silicide.

Figure 5:
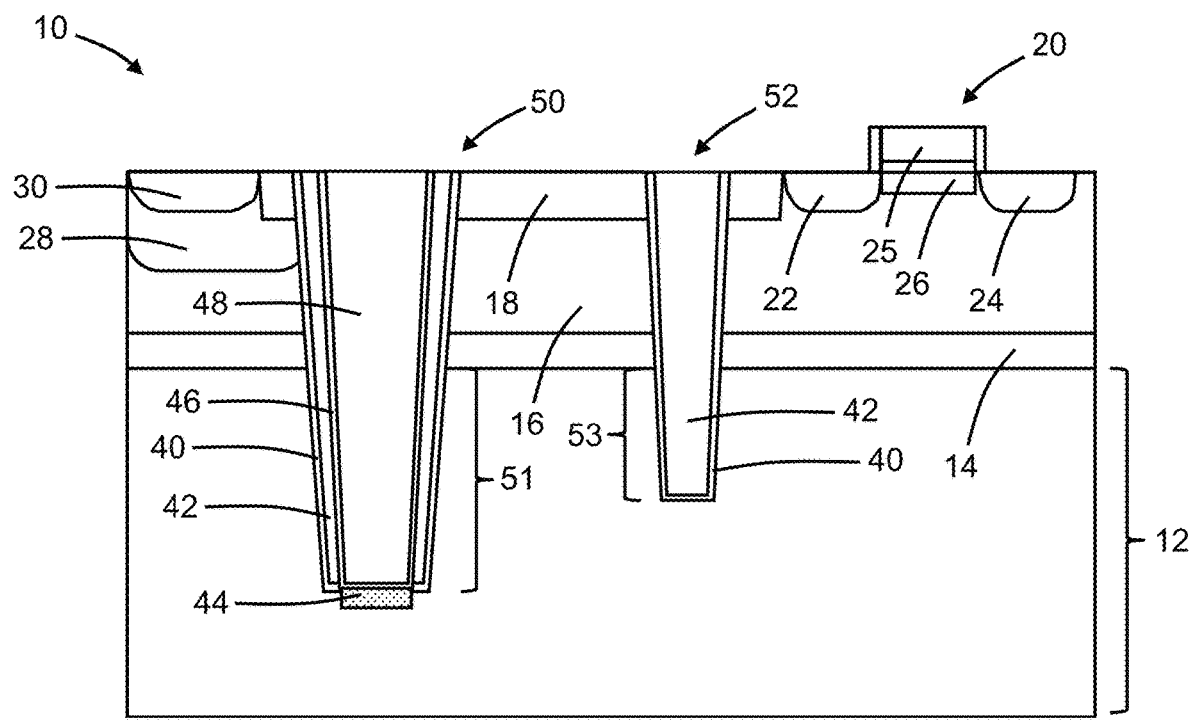
FIG. 5 is a cross-sectional view of the structure at a fabrication stage subsequent to FIG. 4.

With reference to FIG. 5 in which like reference numerals refer to like features in FIG. 4 and at a subsequent fabrication stage, a liner 46 comprised of a metal may be deposited on the sidewalls 35 of the trench 36. In an embodiment, the liner 46 may be comprised of titanium, titanium nitride, or a layered combination of these metals. A metal layer 48 is formed on the conductive region 44 and the liner 46 inside the trench 36, followed by the performance of a planarization process, to complete the formation of a deep trench isolation region 50. In an embodiment, the metal layer 48 may be comprised of tungsten. In an embodiment, the metal layer 48 and the liner 46 may be comprised of different metals.

The metal layer 48 may provide a core or plug of the deep trench isolation region 50 that is electrically and physically coupled by the conductive region 44 to the semiconductor substrate 12. The liner 46 is laterally positioned between the metal layer 48 and the dielectric layers 40, 42, the dielectric layers 40, 42 are laterally positioned between the metal layer 48 and the semiconductor layer 16, and the dielectric layers 40, 42 are also laterally positioned between the metal layer 48 and the doped layer 14. The deep trench isolation region 50 also includes the dielectric layers 40, 42 that provide electrical isolation of the metal layer 48 from the doped layer 14 and the semiconductor layer 16, as well as the liner 46 that may provide a barrier to outward diffusion of metal atoms from the metal layer 48. The deep trench isolation region 50 and, in particular, the metal layer 48 extends through a portion of the shallow trench isolation region 18, a portion of the semiconductor layer 16 beneath the shallow trench isolation region 18, and a portion of the doped layer 14 to end within the semiconductor substrate 12. The metal layer 48 has an end portion 51 inside the semiconductor substrate 12 that contacts the conductive region 44, which provides an electrical connection to the semiconductor substrate 12. The conductive region 44 is positioned between the end portion 51 of the metal layer 48 and the semiconductor substrate 12.

The planarization also forms a trench isolation region 52 that is laterally positioned between the deep trench isolation region 50 and the device structure 20. The trench isolation region 52, which includes the dielectric materials of the dielectric layers 40, 42, has an end portion 53 that is laterally positioned in the semiconductor substrate 12 between the end portion 51 of the deep trench isolation region 50 and a portion of the semiconductor substrate 12 beneath the device structure 20. In an embodiment, the deep trench isolation region 50 and the trench isolation region 52 may surround the device structure 20.

The use of a metal, such as tungsten, enables the plug of the deep trench isolation region 50 to have a significantly lower resistivity in comparison with a doped polysilicon plug. The lower resistivity may improve the latch-up resistance of the device structure 20 because the resistance of the deep trench isolation region 50 providing the contact to the semiconductor substrate 12 is reduced. In addition, the occurrence of dislocations may be minimized because of, for example, a lower thermal budget for the process forming the deep trench isolation region 50. The process flow forming the deep trench isolation region 50 may be simplified in comparison with conventional process flows.

Figure 6:
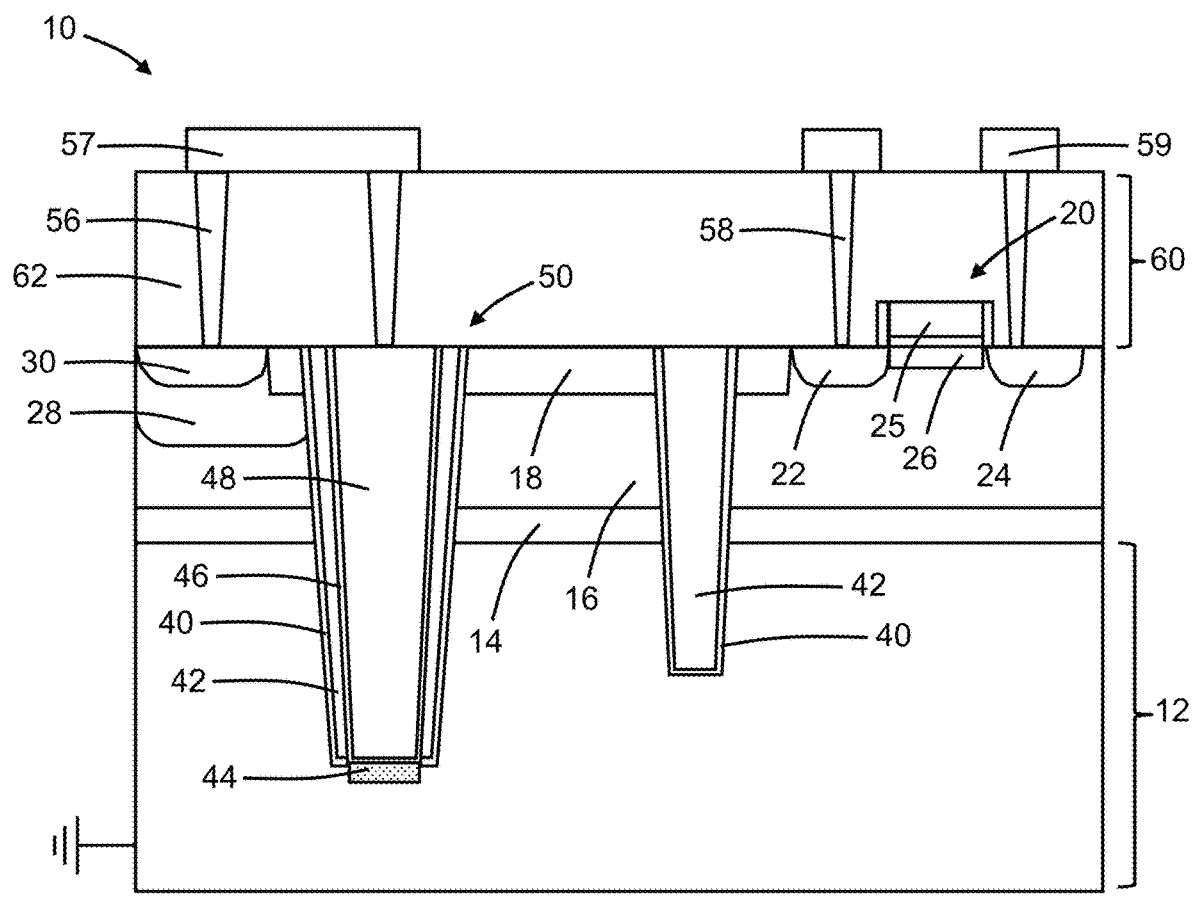
FIG. 6 is a cross-sectional view of the structure at a fabrication stage subsequent to FIG. 5.

With reference to FIG. 6 in which like reference numerals refer to like features in FIG. 5 and at a subsequent fabrication stage, an interconnect structure 60 may be formed that includes contacts 56, a metal feature 57, contacts 58, and metal features 59 that are coupled to the metal layer 48 of the deep trench isolation region 50 and the device structure 20. The interconnect structure 60 also includes a dielectric layer 62. The contacts 56, 58 may be comprised of a metal, such as tungsten, and the metal features 57, 59 may be comprised of a metal, such as copper, and the dielectric layer 62 may be comprised of a dielectric material, such as silicon dioxide, that is an electrical insulator. A silicide layer (not shown) may include sections that are formed on the source/drain regions 22, 24 and on the doped region 30 before the contacts 56, 58 are formed.

The contacts 56 electrically and physically couple the metal feature 57 to the metal layer 48 of the deep trench isolation region 50 and the doped region 30. As a result, the semiconductor layer 16 is coupled to the semiconductor substrate 12, which may be grounded. The contacts 58 electrically and physically couple the source/drain regions 22, 24 of the device structure 20 to the metal features 59.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate;
   a semiconductor layer on the semiconductor substrate;
   a doped region in the semiconductor layer;
   a doped layer between the semiconductor layer and the semiconductor substrate;
   a first trench isolation region including a metal layer that extends through the semiconductor layer and the doped layer into the semiconductor substrate; and
   an interconnect structure including a metal feature, a first contact extending from the metal feature to the doped region, and a second contact extending from the metal feature to the metal layer of the first trench isolation region.

2. The structure of claim 1 wherein the metal layer of the first trench isolation region comprises tungsten.

3. The structure of claim 1 wherein the first trench isolation region includes a dielectric layer laterally positioned between the metal layer and the semiconductor layer.

4. The structure of claim 3 wherein the dielectric layer of the first trench isolation region is also laterally positioned between the metal layer and the doped layer.

5. The structure of claim 4 wherein the semiconductor substrate has a first conductivity type, and the semiconductor layer and the doped layer have a second conductivity type that is different from the first conductivity type.

6. The structure of claim 3 wherein the first trench isolation region includes a liner laterally positioned between the metal layer and the dielectric layer.

7. The structure of claim 6 wherein the metal layer comprises a first metal and the liner comprises a second metal different from the first metal.

8. The structure of claim 6 wherein the metal layer of the first trench isolation region comprises tungsten, and the liner comprises titanium, titanium nitride, or a combination thereof.

9. The structure of claim 3 wherein the metal layer of the first trench isolation region includes an end portion inside the semiconductor substrate, and further comprising:

a conductive region between the end portion of the metal layer of the first trench isolation region and the semiconductor substrate.

10. The structure of claim 1 wherein the metal layer of the first trench isolation region includes an end portion inside the semiconductor substrate.

11. The structure of claim 10 further comprising:
a conductive region between the end portion of the metal layer of the first trench isolation region and the semiconductor substrate.

12. The structure of claim 11 wherein the conductive region comprises a silicide.

13. The structure of claim 10 further comprising:
a device structure; and
a second trench isolation region comprising a dielectric material, the second trench isolation region including an end portion in the semiconductor substrate, and the end portion of the second trench isolation region laterally between the end portion of the first trench isolation region and a portion of the semiconductor substrate beneath the device structure.

14. The structure of claim 13 wherein the device structure includes a source/drain region in the semiconductor layer and a gate.

15. The structure of claim 13 wherein the end portion of the first trench isolation region extends to a greater depth in the semiconductor substrate than the second trench isolation region.

16. The structure of claim 1 wherein the doped region and the semiconductor layer have a first conductivity type, and the semiconductor substrate has a second conductivity type different from the first conductivity type.

17. The structure of claim 16 wherein the semiconductor substrate is configured to be coupled to a ground potential.

18. The structure of claim 1 wherein the metal layer of the first trench isolation region includes an end portion inside the semiconductor substrate.

19. The structure of claim 18 further comprising:
a conductive region between the end portion of the metal layer of the first trench isolation region and the semiconductor substrate, the conductive region comprising a silicide.

20. A method comprising:
forming a semiconductor layer on a semiconductor substrate;
forming a doped layer between the semiconductor layer and the semiconductor substrate;
forming a trench isolation region including a metal layer that extends through the semiconductor layer and the doped layer into the semiconductor substrate;
forming a doped region in the semiconductor layer; and
forming an interconnect structure including a metal feature, a first contact extending from the metal feature to the doped region, and a second contact extending from the metal feature to the metal layer of the trench isolation region.

* * * * *